(12) United States Patent
Strehmel et al.

(10) Patent No.: US 8,632,937 B2
(45) Date of Patent: Jan. 21, 2014

(54) UV-SENSITIVE LITHOGRAPHIC PRINTING PLATE PRECURSOR WITH BENZOXAZOLE DERIVATIVE AND ANALOGUES THEREOF AS SENSITIZER

(75) Inventors: Bernd Strehmel, Berlin (DE); Harald Baumann, Osterode/Harz (DE)

(73) Assignee: Eastman Kodak Company, Rochester, NY (US)

(*) Notice: Subject to any disclaimer, the term of this patent is extended or adjusted under 35 U.S.C. 154(b) by 1566 days.

(21) Appl. No.: 12/161,720

(22) PCT Filed: Jan. 31, 2007

(86) PCT No.: PCT/EP2007/000830
§ 371 (c)(1),
(2), (4) Date: Jul. 22, 2008

(87) PCT Pub. No.: WO2007/090550
PCT Pub. Date: Aug. 16, 2007

(65) Prior Publication Data
US 2010/0291355 A1    Nov. 18, 2010

(30) Foreign Application Priority Data
Feb. 8, 2006 (DE) .................. 10 2006 005 826

(51) Int. Cl.
B41M 5/00 (2006.01)
B41N 1/00 (2006.01)
G03F 7/00 (2006.01)
G03F 7/26 (2006.01)
C07D 413/00 (2006.01)
C07D 498/00 (2006.01)

(52) U.S. Cl.
USPC ............ 430/270.1; 430/302; 430/271.1; 430/281.1; 430/286.1; 101/453; 101/463.1; 548/217; 548/224

(58) Field of Classification Search
USPC .......... 430/270.1, 302; 101/450.1, 453, 463.1
See application file for complete search history.

(56) References Cited

U.S. PATENT DOCUMENTS 4,966,830 A * 10/1990 Nagasaka et al. .......... 430/281.1

FOREIGN PATENT DOCUMENTS

EP           0300410 B1 *  7/1988
EP           0 300 410      10/1994
JP           2002221790 A *  8/2002

OTHER PUBLICATIONS

The J. of Physical Chemistry, "Van der Walls Volumes and Radii", by A. Bondi, vol. 68, #3, Mar. 16, 1994.
J. of Organic Chemistry, "Fast Calculation of van der Walls Volume as a Sum of Atomic and Bond Contributions and its Application to Drug Compounds" by Y.H. Zhao et al., vol. 68, 2003, pp. 7368-7373.

* cited by examiner

Primary Examiner — Chanceity Robinson
(74) Attorney, Agent, or Firm — J. Lanny Tucker

(57) ABSTRACT

Lithographic printing plate precursor comprising (a) a lithographic substrate with a hydrophilic surface and (b) a radiation-sensitive coating on the hydrophilic surface comprising (i) one or more types of monomers and/or oligomers and/or polymers, each comprising at least one ethylenically unsaturated group accessible to a free-radical polymerization, (ii) at least one sensitizer, and (iii) at least one coinitiator capable of forming free radicals together with the sensitizer, said coinitiator being other than metallocenes, characterized in that the at least one sensitizer comprises a compound of formula (I) wherein at least one of the groups $R_9$ to $R_{12}$ is a bulky group which has a van der Waals volume of at least 55 Å$^3$.

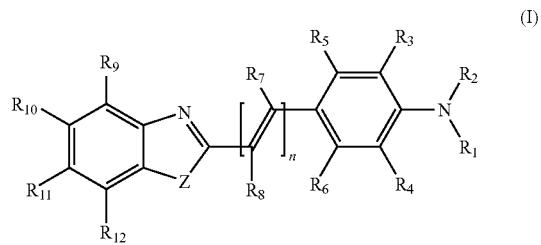
(I)
14 Claims, 1 Drawing Sheet

UV-SENSITIVE LITHOGRAPHIC PRINTING PLATE PRECURSOR WITH BENZOXAZOLE DERIVATIVE AND ANALOGUES THEREOF AS SENSITIZER

The present invention relates to negative working UV-sensitive lithographic printing plate precursors whose radiation-sensitive coating comprises certain benzoxazole derivatives or analogues as sensitizers. The invention furthermore relates to a process for the production of such precursors, a process for imaging such precursors and an imaged printing form as well as sensitizers and radiation-sensitive compositions comprising such sensitizers for the production of such precursors.

The technique of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. Alternatively, the plate can also be exposed digitally without a film, e.g. with a UV laser. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. printing plate precursors. However, an improved sensitivity in particular in the near UV and visible spectral ranges is required for new and advanced applications (e.g. exposure by means of lasers) so that the exposure time can be shortened. From an economic point of view it is of interest to use radiation sources with a reduced photon output instead of high-performance lasers since they are less expensive at the present time. Therefore, efforts have been made for some time to increase the sensitivity of photosensitive mixtures that are to be used in photopolymerizable compositions.

U.S. Pat. No. 3,912,606 describes UV-hardenable compositions for films and coatings which in addition to ethylenically unsaturated monomers comprise a photoinitiator selected from haloalkyl benzoxazoles, benzimidazoles and benzothiazoles. In these compositions as well, the efficiency of the photoinitiator is insufficient.

EP-A-0 741 333 describes photopolymerizable compositions which in addition to ethylenically unsaturated monomers and organic binders comprise a combination of an optical brightener and a photoinitiator selected from acyl and diacyl phosphine oxides. As optical brighteners, those comprising a stilbene, triazine, thiazole, benzoxazole, coumarin, xanthene, triazole, oxazole, thiophene or pyrazoline unit are listed. However, based on today's standards, these photopolymerizable compositions do not exhibit sufficient sensitivity.

U.S. Pat. No. 3,647,467 describes "photo-activable" compositions comprising a hexaarylbiimidazole and a heterocyclic compound $Ar^1$-G-$Ar^2$ (wherein $Ar^1$ is an aryl group with 6 to 12 ring carbon atoms, $Ar^2$ is either $Ar^1$ or a group arylene-G-$Ar^1$ and G is a divalent furan, oxazole or oxadiazole ring). However, the radiation sensitivity of these compositions does not meet present-day requirements.

2-Mercaptobenzoxazoles are used as chain transfer agents in "photo-activable" compositions for example in U.S. Pat. No. 3,652,275. However, these compounds do not function as radiation absorbers (sensitizers) in the sense of the present invention.

WO 2004/074930 A2 describes radiation-sensitive compositions comprising a 2,4,5-aryloxazole as a sensitizer. These compositions exhibit good sensitivity but resolution is insufficient for highest demands.

EP 1 349 006 A1 describes a photopolymerizable composition wherein the sensitizer is an optical brightener; this optical brightener absorbs light of a wavelength of 300 to 450 nm and exhibits fluorescence in the range of 400 to 500 nm, i.e. blue to violet fluorescent light. An improvement of the resolution would be desirable.

EP 1 510 865 A2 discloses photopolymerizable compositions comprising a 1,3,5-triazine compound and a titanocene, or a trihalogenmethyl compound with a molar extinction coefficient of no more than 1,000 at laser wavelength and a titanocene. Compounds of formula (4) are for example used as sensitizer dye

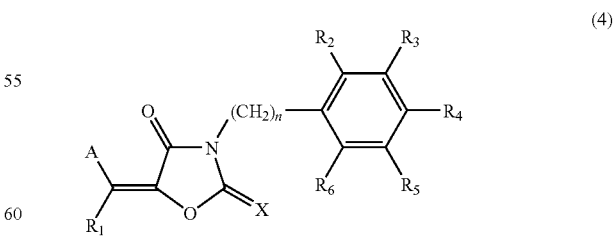

(4)

In this composition, the titanocenes are essential for good sensitivity, however, they entail a poor yellow light stability which is not desirable due to the resulting poor handlability.

U.S. Pat. No. 6,267,913 B1 and WO 02/079691 A1 describe compounds which are said to be suitable for a simultaneous 2-photon absorption. No lithographic printing plate precursors are described. Furthermore, no compounds with tertiary amino groups with aromatic substituents and a benzoxazole or benzothiazole unit substituted with bulky groups are described, either.

WO 01/96962 A2 and US 2001/0003032 disclose irradiation methods for broad ranges of photopolymers with short pulse lasers, resulting in polymerization initiated by two photons.

It is the object of the present invention to provide lithographic printing plate precursors which show a high degree of radiation sensitivity in the range of 350 to 480 nm in combination with good storage stability and excellent resolution and which, due to an improved adhesion of the printing areas, lead to a high print run length on the printing machine; furthermore, the printing plate precursors should exhibit excellent yellow light stability.

This object is achieved by a lithographic printing plate precursor comprising
(a) a lithographic substrate with a hydrophilic surface and
(b) a radiation-sensitive coating on the hydrophilic surface comprising
  (i) one or more types of monomers and/or oligomers and/or polymers, each comprising at least one ethylenically unsaturated group accessible to a free-radical polymerization,
  (ii) at least one sensitizer,
  (iii) at least one coinitiator capable of forming free radicals together with the sensitizer (ii), said coinitiator being other than metallocenes, and
  (iv) optionally one or more components selected from the group consisting of alkali-soluble binders, colorants, exposure indicators, plasticizers, chain transfer agents, surfactants, inorganic fillers and thermopolymerization inhibitors,
characterized in that the at least one sensitizer comprises a compound of formula (I)

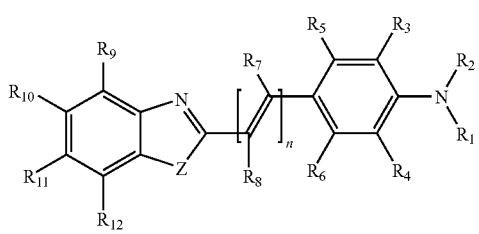

wherein
$R_4$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$^2$, N(R)$_3^+$, and —PO$_3$(R)$_2$, wherein each R is selected from H, alkyl, aryl, aralkyl and alkylaryl;
$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl;
$R_4$ and $R_6$ can form a 5- or 6-membered fused aromatic ring;
$R_7$ and $R_8$ are independently selected from the group consisting of hydrogen, CN, halogen, and unsubstituted and substituted alkyl, alkylaryl, aralkyl, and aryl;

n is selected from 0, 1 and 2;
Z represents O, S, Se or NR, wherein R is selected from the group consisting of hydrogen, alkyl, aryl, aralkyl and alkylaryl;
$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl and alkylaryl, provided that at least one of the groups $R_9$ to $R_{12}$ is a bulky group which has a van der Waals volume of at least 55 Å$^3$;
and wherein
either
$R_1$ and $R_2$ together with the nitrogen atom to which they are attached form an N-heteroaryl group which optionally exhibits one or two fused benzene rings; and
$R_3$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$ and —PO$_3$(R)$_2$, wherein each R is selected from H, alkyl, aryl, aralkyl and alkylaryl;
or
$R_2$ is selected from the group consisting of unsubstituted and substituted aryl, and unsubstituted and substituted heteroaryl, said aryl or heteroaryl groups being linked to $R_3$ to form an N-heterocyclic ring; and
$R_1$ is selected from the group consisting of hydrogen, unsubstituted and substituted aryl, unsubstituted and substituted heteroaryl, and unsubstituted and substituted alkyl;
if $R_2$ is not linked to $R_3$, $R_3$ and $R_5$ can form a 5- or 6-membered fused aromatic ring.

Figure 1:
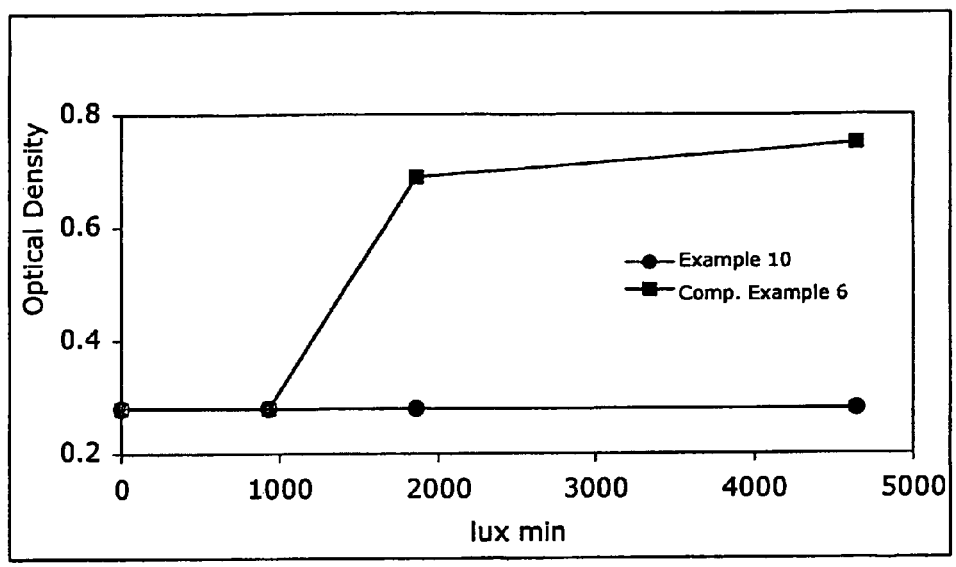
FIG. 1 illustrates the yellow light stability of the printing plate precursor of Example 10 in comparison with that of the printing plate precursor of Comparative Example 6.

Unless defined otherwise, the term "alkyl group" as used in the present invention refers to a straight-chain, branched or cyclic saturated hydrocarbon group preferably comprising 1 to 25 carbon atoms, especially preferred 1 to 18 carbon atoms and most preferred 1 to 10 carbon atoms. The alkyl group can optionally comprise one or more substituents (preferably 0 to 3 substituents) selected for example from halogen atoms (fluorine, chlorine, bromine, iodine), CN, NO$_2$, NR'$_2$, NR'$_3^+$ COOR', OR' and SR' (R' independently represents a hydrogen atom, an alkyl group or an aryl group). The above definition also applies to the alkyl unit of an alkylaryl group and aralkyl group.

Unless defined otherwise, the term "aryl group" as used in the present invention refers to an aromatic carbocyclic group with one or more fused rings, which preferably comprises 5 to 14 carbon atoms. The aryl group can optionally comprise one or more substituents (preferably 0 to 3) selected for example from halogen atoms, allyl groups, alkoxy groups, CN, NO$_2$, NR'$_2$, NR'$_3^+$ COOR', OR' and SR' (wherein each R' is independently selected from hydrogen, alkyl and aryl). Preferred examples include a phenyl group and a naphthyl group which can optionally be substituted. The above definition also applies to the aryl unit of an alkylaryl group and an aralkyl group.

A fused ring or ring system as referred to in the present invention is a ring that shares two atoms with the ring to which it is fused.

Unless defined otherwise, the term "heteroaromatic group" as used in the present invention refers to a 5- or 6-membered aromatic ring, wherein one or more ring carbon atoms are replaced with heteroatoms selected from N, NR', S and O (preferably N or NR'). The heteroaromatic ring can optionally comprise one or more substituents, selected for example from alkyl groups, aryl groups, aralkyl groups, halogen atoms, —OR', —NR'$_2$, —C(O)OR', C(O)NR'$_2$ and CN. Each R' is independently selected from hydrogen, alkyl, aryl and aralkyl.

Radiation-Sensitive Coating

Monomers, Oligomers and Polymers

All monomers, oligomers and polymers which are free-radical polymerizable and comprise at least one C—C double bond can be used as ethylenically unsaturated monomers, oligomers and polymers. Monomers/oligomers/polymers with C—C triple bonds can also be used, but they are not preferred. Suitable compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and dimethacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride copolymers and hydroxyalkyl(meth)acrylates (cf. e.g. DE-A-4 311 738); (meth)acrylic acid polymers, partially or fully esterified with allyl alcohol (cf. e.g. DE-A-3 332 640); reaction products of polymeric polyalcohols and isocyanatoalkyl (meth)acrylates; unsaturated polyesters; (meth)acrylate-terminated polystyrenes; poly(meth)acrylic acid esters, poly (meth)acrylic acids, poly(meth)acrylamides; (meth)acrylic acid polymers, partially or fully esterified with epoxides comprising free-radical polymerizable groups; and polymers with allyl side-groups which can for example be obtained by polymerization of allyl(meth)acrylate, optionally with further comonomers.

Free-radical polymerizable compounds that can be used in the present invention also include compounds that have a molecular weight of 3,000 or less and are reaction products obtained by reacting a diisocyanate with (i) an ethylenically unsaturated compound with a hydroxy group, and at the same time (ii) a saturated organic compound with an NH group and an OH group, wherein the reactants are used in amounts according to the following condition:

Number of moles of isocyanate groups≤number of moles of OH plus NH groups.

Examples of diisocyanates are represented by the following formula:

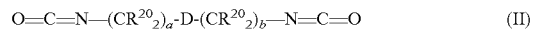

$$O=C=N—(CR^{20}_2)_a\text{-}D\text{-}(CR^{20}_2)_b—N=C=O \qquad (II)$$

wherein a and b independently represent 0 or an integer from 1 to 3, each $R^{20}$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups and secondary or primary amino groups.

$R^{20}$ is preferably H or $CH_3$.

a and b are preferably independently 0 or 1.

D can for example be an alkylene group $(CH_2)_w$, wherein w is an integer from 1 to 12, preferably 1 to 6, and one or more hydrogen atoms are optionally replaced with substituents such as e.g. alkyl groups (preferably $C_1$-$C_6$), a cycloallylene group, an arylene group or a saturated or unsaturated heterocyclic group.

Suitable diisocyanates are for example the following:
Trimethylhexamethylene diisocyanate
1,6-bis-[isocyanate]-hexane
5-isocyanate-3-(isocyanatomethyl)-1,1,3-trimethylcyclohexane
1,3-bis-[5-isocyanate-1,1,3-trimethyl-phenyl]-2,4-dioxo-1,3-diazetidine
3,6-bis[9-isocyanatononyl]-4,5-di-(1-heptenyl)-cyclohexene
bis-[4-isocyanate-cyclohexyl]-methane
trans-1,4-bis-[isocyanate]-cyclohexane
1,3-bis-[isocyanatomethyl]-benzene
1,3-bis-[1-isocyanate-1-methyl-ethyl]-benzene
1,4-bis-[2-isocyanatoethyl]-cyclohexane
1,3-bis-[isocyanatomethyl]cyclohexane
1,4-bis-[1-isocyanate-1-methyl-ethyl]benzene
bis-[isocyanate]-isododecyl-benzene
1,4-bis-[isocyanate]-benzene
2,4-bis-[isocyanate]-toluene
2,6-bis-[isocyanate]-toluene
N,N'-bis-[3-isocyanate-4-methyl-phenyl]urea.
1,3-bis-[3-isocyanate-4-methyl-phenyl]-2,4-dioxo-1,3-diazetidine
bis-[2-isocyanate-phenyl]-methane
(2-isocyanate-phenyl)-(4-isocyanate-phenyl)-methane
bis-[4-isocyanate-phenyl]-methane
1,5-bis-[isocyanate]-naphthalene
4,4'-bis-[isocyanate]-3,3'-dimethyl-biphenyl The ethylenically unsaturated compound (i), which comprises a hydroxy group, comprises at least one non-aromatic C—C double bond, which is preferably terminal. The hydroxy group is preferably not bonded to a doubly bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include

Hydroxy($C_1$-$C_{12}$)alkyl(meth)acrylates (e.g. 2-hydroxyethyl(meth)acrylate, 2- or 3-hydroxypropyl(meth)acrylate, 2-, 3- or 4-hydroxybutyl(meth)acrylate), hydroxy($C_1$-$C_{12}$)

alkyl(meth)acrylamides (e.g. 2-hydroxyethyl(meth)acrylamide, 2- or 3-hydroxypropyl(meth)acrylamide, 2-, 3- or 4-hydroxybutyl(meth)acrylamide), mono(meth)acrylates of oligomeric or polymeric ethylene glycols or propylene glycols (e.g. polyethylene glycol mono(meth)acrylate, triethylene glycol mono(meth)acrylate), allyl alcohol, pentaerythritol tri(meth)acrylate, 4-hydroxy($C_1$-$C_{12}$)alkylstyrene (e.g. 4-hydroxymethylstyrene), 4-hydroxystyrene, hydroxycyclohexyl(meth)acrylate.

The term "(meth)acrylate" etc. as used in the present invention indicates that both methacrylate and acrylate etc. are meant.

The saturated organic compound (ii) is a compound with one OH and one NH group.

The saturated organic compound (ii) can for example be represented by the following formula (III) or (IV)

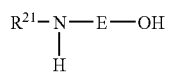

(III)

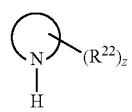

(IV)

wherein $R^{21}$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group,

represents a saturated heterocyclic ring with 5 to 7 ring atoms, which in addition to the nitrogen atom shown above optionally comprises another heteroatom selected from S, O and $NR^{23}$, wherein $R^{23}$ is an alkyl group optionally substituted with an OH group, $R^{22}$ is OH or a straight-chain, branched or cyclic alkyl group substituted with an OH group, and z=0 if the heterocyclic ring comprises $NR^{23}$ and $R^{23}$ is an alkyl group substituted with OH and z=1 if the saturated heterocyclic ring does not comprise $NR^{23}$ or if the saturated heterocyclic ring comprises $NR^{23}$ and $R^{23}$ is an unsubstituted alkyl group.

Of the compounds of formula (III), those are preferred wherein E represents —$CH_2CH_2$— and $R^{21}$ is a straight-chain $C_1$-$C_{12}$ (preferably $C_1$-$C_4$) alkyl group.

Of the compounds of formula (IV), those are preferred wherein either no additional heteroatom is present in the ring and $R^{22}$ is an alkyl group substituted with OH (i.e. hydroxyalkyl-substituted piperidines), or a group $NR^{23}$ is present in the ring and $R^{23}$ is an alkyl group substituted with OH (i.e. N-hydroxyalkyl-substituted piperazines).

In particular, the following compounds should be mentioned as compound (ii):

2- or 3-(2-hydroxyethyl)piperidine, 2- or 3-hydroxymethylpiperidine,

N-(2-hydroxyethyl)piperazine and

N-(2-hydroxymethyl)piperazine.

The number of moles of isocyanate groups must not exceed the number of moles of OH groups and NH groups combined since the product should not comprise any more free isocyanate groups.

The reaction of the diisocyanate and the ethylenically unsaturated compound (i) and the saturated compound (ii) usually takes place in an aprotic solvent such as a ketone (e.g. acetone, methyl ethyl ketone, diethyl ketone, cyclopentanone and cyclohexanone), an ether (e.g. diethyl ether, diisopropyl ether, tetrahydrofuran, dioxane and 1,2-dioxolane) and an ester (e.g. ethyl acetate, methyl acetate, butyl acetate, ethylene glycol diacetate, methyl lactate and ethyl lactate) or in a technical solvent such as ethylene glycol monomethyl ether acetate, propylene glycol monomethyl ether acetate etc.

It is preferred to use a catalyst for condensation reactions. All known catalysts suitable for condensation reactions can be used. Examples include tertiary amities, such as triethylamine, pyridine etc. and tin compounds, such as dibutyltin dilaurate.

The reaction preferably takes place at 10 to 120° C., especially preferred at 30 to 70° C.

Under optimized synthesis conditions a uniform product can be obtained. However, as a rule it has to be assumed that a mixed product is formed. The molecular weight of the product should be 3,000 or less. In the case of a mixed product, the molecular weight is the weight-average molecular weight. Both a uniform reaction product and a mixed product can be used as a free-radical polymerizable compound in the present invention.

Additional suitable C—C unsaturated free-radical polymerizable compounds are described e.g. in EP-A-1 176 007.

It is of course possible to use different kinds of monomers, oligomers or polymers in the mixture; furthermore, mixtures of monomers and oligomers and/or polymers can be used in the present invention, as well as mixtures of oligomers and polymers. The free-radical polymerizable monomers/oligomers/polymers are preferably present in an amount of 5 to 95 wt.-%; if monomers/oligomers are used, especially preferred 20 to 85 wt.-%, based on the dry layer weight of a radiation-sensitive coating prepared from the radiation-sensitive composition of the present invention. As used in the present invention, the term "dry layer weight of the radiation-sensitive coating" is therefore synonymous with the term "solids of the radiation-sensitive composition".

Sensitizer

A sensitizer as referred to in the present invention is a compound which can absorb radiation when it is exposed but which cannot by itself, i.e. without the addition of coinitiators, form free radicals.

In the present invention, one sensitizer or a mixture of two or more can be used.

According to the present invention, the sensitizer comprises a compound of formula (I):

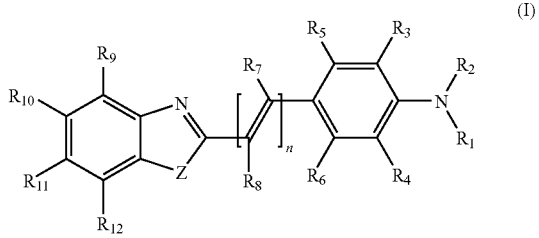

(I)

wherein $R_4$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from H, alkyl, aryl, aralkyl and alkylaryl;

$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl;

$R_4$ and $R_6$ can form a 5- or 6-membered fused aromatic ring;

$R_7$ and $R_8$ are independently selected from the group consisting of hydrogen, CN, halogen, and unsubstituted and substituted alkyl, alkylaryl, aralkyl, and aryl;

n is selected from 0, 1 and 2;

Z represents O, S, Se or NR, wherein R is selected from the group consisting of hydrogen, alkyl, aryl, aralkyl and alkylaryl;

$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl and alkylaryl, provided that at least one of the groups $R_9$ to $R_{12}$ is a bulky group which has a van der Waals volume of at least 55 Å$^3$;

and wherein either $R_1$ and $R_2$ together with the nitrogen atom to which they are attached form an N-heteroaryl group which optionally exhibits one or two fused benzene rings; and $R_3$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$ and —PO$_3$(R)$_2$, wherein each R is selected from H, alkyl, aryl, aralkyl and alkylaryl;

or $R_2$ is selected from the group consisting of unsubstituted and substituted aryl, and unsubstituted and substituted heteroaryl, said aryl or heteroaryl groups being linked to $R_3$ to form an N-heterocyclic ring; and $R_1$ is selected from the group consisting of hydrogen, unsubstituted and substituted aryl, unsubstituted and substituted heteroaryl, and unsubstituted and substituted alkyl;

if $R_2$ is not linked to $R_3$, $R_3$ and $R_5$ can form a 5- or 6-membered fused aromatic ring.

Z preferably represents O.

n is preferably selected from 0 and 1, and it is especially preferred that n=1.

Preferably, one or two of the groups $R_9$ to $R_{12}$ represent(s) a bulky group with a van der Waals volume of at least 55 Å$^3$; it is particularly preferred that one of the groups $R_9$ to $R_{12}$ represent such a bulky group and especially preferred that $R_{10}$ represents such a bulky group. The bulky group is preferably tert-butyl.

$R_7$ and $R_8$ are preferably both hydrogen atoms.

$R_5$ and $R_6$ are preferably both hydrogen atoms.

$R_4$ is preferably a hydrogen atom.

The inventors of the present invention surprisingly found that it is decisive for the solution of the problem underlying the present invention that at least one of the groups $R_9$ to $R_{12}$ be so bulky that its van der Waals volume is at least 55 Å$^3$; preferably, the van der Waals volume is at least 65 Å$^3$, especially preferred at least 70 Å$^3$.

Since the van der Waals volume constitutes an important aspect of the present invention, it will be briefly explained in the following how to determine this value:

In J. Phys. Chem., Vol. 68, No. 3 (1964), 441-451, A. Bondi describes how the van der Waals volume ($V_w$ in cm$^3$/mole) of organic groups can be calculated (see in particular FIG. 3 and the accompanying explanations); the values of some groups are also listed in Table XV.

The van der Waals volume determined according to A. Bondi in cm$^3$/mole can be converted into the volume in Å$^3$ using the following equation:

$$V_w(\text{Å}^3) = V_w(\text{cm}^3/\text{mole}) \cdot \frac{10^{24}}{N_A} \quad (1)$$

wherein $N_A = 6.0221367 \cdot 10^{23}$ mole$^{-1}$

Table 1a below lists the van der Waals volumes of some structural increments:

TABLE 1a

| Group | $V_w$ (cm$^3$/mole)* | $V_w$ (Å$^3$)** |
|---|---|---|
| —C— | 3.33 | 5.53 |
| —CH— | 6.78 | 11.26 |
| >CH$_2$ | 10.23 | 16.98 |
| —CH$_3$ | 13.67 | 22.70 |
| =C= | 6.96 | 11.56 |
| >C=C< | 10.02 | 16.64 |
| =CH— | 8.47 | 14.06 |
| =CH$_2$ | 11.94 | 19.82 |
| >C=CH$_2$ | 16.95 | 28.14 |
| >C=CH— | 13.49 | 22.40 |
| Phenyl | 45.84 | 76.11 |
| Naphthyl | 71.45 | 118.63 |
| F | 5.72 | 9.50 |
| Cl | 11.62 | 19.31 |
| Br | 14.4 | 23.91 |

TABLE 1a-continued

| Group | $V_w$ (cm³/mole)* | $V_w$ (Å³)** |
|---|---|---|
| CN | 14.7 | 24.41 |
| —O— | 3.7 | 6.14 |
| —S— | 10.8 | 17.93 |
| C=O | 11.7 | 19.43 |

*Values were taken from Tables XV and XVI of J. Phys. Chem., Vol. 68 (1964), 441-451

**calculated based on equation (1) above

For the purposes of the present invention, the van der Waals volume of specific organic groups is determined by adding the corresponding values of the "increments" and rounding the result to a value without decimal places. This is explained in the following examples:

TABLE 1b

| Group | Increments | $V_w$ (Å³)** |
|---|---|---|
| t-Butyl | —C— + 3x-CH₃ | 74 (73.63) |
| i-Propyl | 2-CH₃ + —C—H | 57 (56.66) |
| n-Propyl | —CH₃ + 2 >CH₂ | 57 (56.66) |
| Ethyl | —CH₃ + >CH₂ | 40 (39.68) |
| C(Ph)₃ | —C— + 3Ph | 234 (233.86) |
| 2-Ethyl-hexyl | 5 >CH₂ + 2x-CH₃ + —CH— | 142 (141.56) |

Substituents with $V_w \geq 55$ Å³ include for example:

TABLE 2

| Name or structure of the substituent[1]) | $V_w$ (Å³)**[2)] |
|---|---|
| n-propyl• | 57 |
| i-propyl• | 57 |
| n-butyl• | 74 |
| i-butyl• | 74 |
| t-butyl• | 74 |
| n-pentyl• | 91 |
| i-pentyl• | 91 |
| t-pentyl• | 91 |
| neo-pentyl• | 91 |
| n-hexyl• | 108 |
| 2-ethylhexyl• | 142 |
| 1-hexylheptyl• | 227 |

TABLE 2-continued

| Name or structure of the substituent[1)] | $V_w$ (Å³)**[2)] |
|---|---|
| (branched alkyl structure) | 295 |
| •phenyl | 76 |
| (benzyl -CH₂•) | 93 |
| (triphenylmethyl C•) | 234 |
| (tetraphenylmethyl) | 310 |
| (3,5-diphenylphenyl) | 228 |
| •O-phenyl | 82 |
| •O-butyl | 80 |
| •O-hexyl | 114 |
| •S-phenyl | 94 |
| •S-butyl | 92 |
| •S-hexyl | 226 |
| •CH₂—O—C(=O)—CH₃ | 56 |
| •CCl₃ | 74 |
| •CF₂CF₃ | 58 |
| •Si(CH₃)₃ | >74 |
| •SO₃CH₃ | 59 |

TABLE 2-continued

| Name or structure of the substituent[1] | $V_w$ (Å$^3$)**[2] |
|---|---|
| •SO$_2$CH$_2$CH$_3$ | 70 |
| •SOCH$_2$CH$_3$ | 64 |
| •CH$_2$N(CH$_3$)$_3$$^+$ | 92 |
| •N(CH$_3$)$_3$$^+$ | 75 |
| •CH$_2$N(CH$_3$)$_2$ | 70 |
| mesityl• | 144 |

[1] the dot • indicates the binding site to the benzene ring
[2] calculated on the basis of the volume contributions of the individual increments according to Table 1a According to one embodiment of the present invention the sensitizer is a compound of formula (Ia) or (Ib):

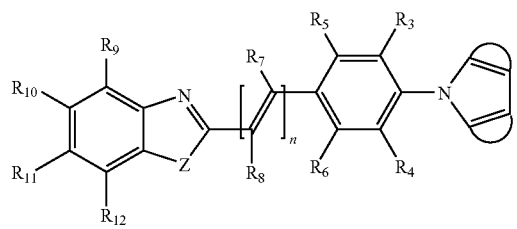

(Ia)

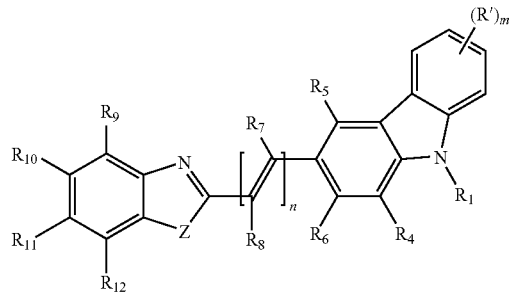

(Ib)

wherein
$R_1$, $R_3$ to $R_{12}$, Z and n are as defined for formula (I) (the preferred definitions are also as the preferred definitions for formula (I));
each

represents an optionally present fused benzene ring;
each R' is independently selected from halogen, alkyl, alkoxy, CN, NO$_2$, NR"$_2$, C(O)H, COOR", OR" and SR";
each R" is independently selected from hydrogen, alkyl and aryl; and
m is 0 or an integer from 1 to 4 (preferably 0, 1 or 2, more preferably 0 or 1).

The following compounds of formula (I) are especially preferred:

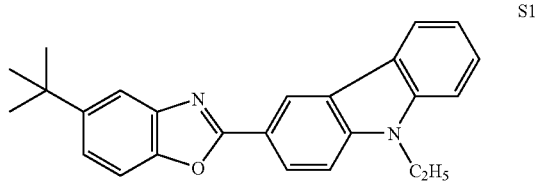
S1

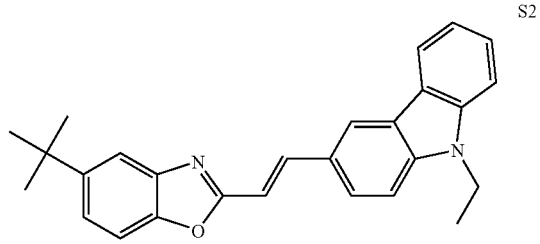
S2

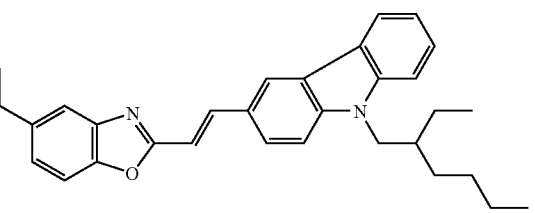
S3

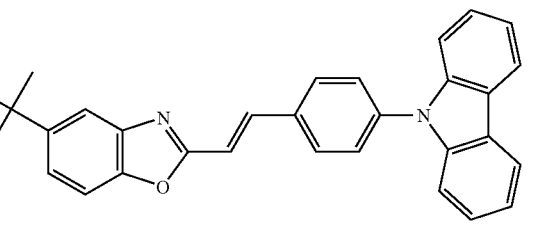
S4

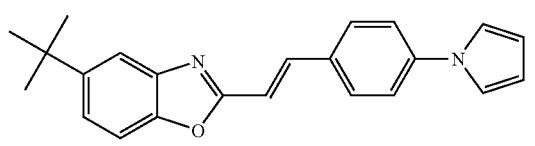
S5

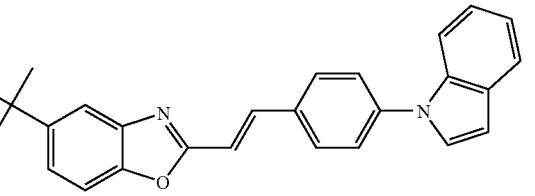
S6

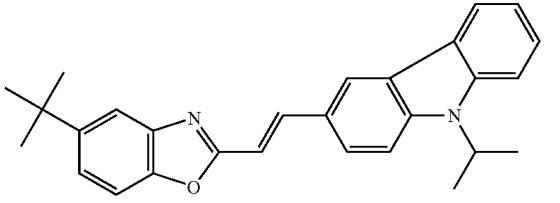
S7

The compounds of formula (I) used in the present invention are also suitable for simultaneous two-photon excitation which can lead to a further improvement of the resolution of the radiation-sensitive coatings in lithographic printing plate precursors. Theoretical discussions of the phenomenon of two-photon excitation can for example be found in Ann. Phys.

1931, 273 (M. Göppert-Mayer), Acc. Chem. Res. 1984, 17, 250 (L. Goodman, R. P. Rava) and Rep. Prog. Phys. 1997, 59, 1041 (J. D. Bhawalkar, G. S. He, P. N. Prasad).

The sensitizers of formula (I) used in the present invention exhibit a strong yellow to greenish fluorescence; these compounds are therefore no optical brighteners.

The compounds of formula (I) used in the present invention can be prepared using processes known to the person skilled in the art, for example processes analogous to the processes described in F. Hamer, The Cyanine Dyes and Related Compounds, The Chemistry of Heterocyclic Compounds, Vol. 18 (Publisher: A. Weissberger), Interscience, New York, 1964;

D. M. Stunner in The Chemistry of Heterocyclic Compounds, Vol. 30 (Publisher: A. Weissberger, E. C. Taylor), Interscience, New York, 1977, S. 441-587; and H. Zollinger, Color Chemistry, VHCA, Publishing House Helvetica Chimica Acta, Wiley-VCH, Zurich, 3$^{rd}$ Edition, 2003;

the processes described therein can also be used for the synthesis of compounds not explicitly disclosed therein by varying the starting compounds accordingly.

The sensitizers are used in combination with one or more coinitiators.

If desired, one or more other sensitizers can be used in addition to the sensitizers according to the present invention as long as they are not incompatible with the solution of the technical problem.

The amount of sensitizer(s) is not particularly restricted; however, it is preferably in the range of 0.2 to 25 wt.-%, based on the solids content or the dry layer weight of a coating produced from the composition, especially preferred 0.5 to 15 wt.-%.

Coinitiators

A coinitiator as referred to in the present invention is a compound that is essentially unable to absorb when irradiated but forms free radicals together with the radiation-absorbing sensitizers used in the present invention; metallocenes are not used as coinitiators in the present invention. The coinitiators can for example be selected from onium compounds, for example those where the onium cation is selected from iodonium, sulfonium, phosphonium, oxylsulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl (e.g. N-alkoxypyridinium salts); N-arylglycines and derivatives thereof (e.g. N-phenylglycine); aromatic sulfonyl halides; trihalomethylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazoles, mercaptooxadiazoles, mercaptotetrazines, mercaptoimidazoles, mercaptotetrazoles, mercaptopyridines, mercaptooxazoles and mercaptotriazoles; they include 2-mercaptobenzoxazole, 2-mercaptobenzothiazole, 2-mercaptobenzimidazole, pentaerythritol-tetrakis(mercaptoacetate), 4-acetamidothiophenol, mercaptosuccinic acid, dodecanthiol, beta-mercaptoethanol, 6-ethoxy-2-mercaptobenzo-thiazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzene thiol, 1-phenyl-1H-tetrazole, 4-phenyl-4H-1,2,4-triazole-3-thiol, pentaerythritol-tetrakis(3-mercaptopropionate), trimethylolpropane-tris(mercaptoacetate), 2-mercaptopyridine, 4-mercaptopyridine, 2-mercapto-3H-quinazoline and 2-mercaptothiazoline); 1,3,5-triazine derivatives with 1 to 3 $CX_3$ groups (wherein every X is independently selected from a chlorine or bromine atom, and is preferably a chlorine atom), such as e.g. 2-phenyl-4,6-bis (trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; α-hydroxy or α-amino acetophenones; acylphosphine oxides, diacylphosphine oxides and peroxides (e.g. those listed in EP-A1-1 035 435 as activators of the type of an organic peroxide).

Hexaarylbiimidazoles and onium compounds as well as mixtures thereof are preferred coinitiators.

Suitable hexaarylbiimidazoles are for example represented by the following formula (V):

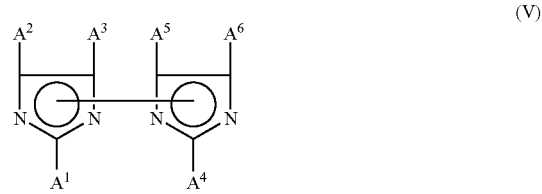

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-bis(bromophenyl)-4,4',5,5'-tetraphenylbiimidazole,
2,2'-bis(p-carboxyphenyl)-4,4',5,5"-tetraphenylbiimidazole,
2,2'-bis(o-chlorophenyl)-4,4',5,5'-tetrakis(p-methoxyphenyl)biimidazole,
2,2'-bis(p-chlorophenyl)-4,4',5,5'-tetrakis(p-methoxyphenyl)biimidazole,
2,2'-bis(p-cyanophenyl)-4,4'5,5'-tetrakis(p-methoxyphenyl) biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl) biimidazole,
2,2'-bis(3,4-methylenedioxyphenyl)-4,4',5,5'-tetraphenylbiimidazole, 2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetaphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenylbiimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)biimidazole,
2,2'-di-9-phenanthryl-4,4',5,5'-tetrakis(p-methoxyphenyl)biimidazole,
2,2'-diphenyl-4,4',5,5'-tetra-4-biphenylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-phenylthiophenyl)biimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl)biimidazole,
2,2'-bis(2-chloro-5-sulfophenyl)-4,4',5,5'-tetraphenylbiimidazole,
2,2',5-tris(2-chlorphenyl)-4-(3,4-dimethoxyphenyl)-4,5'diphenylbiimidazole,
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or
2,2'-bis(o,p-dichlorophenyl)-4,4',5,5'-tetra(o,p-dichlorophenyl)biimidazole.

Suitable hexaarylbiimidazoles are for example described in U.S. Pat. No. 4,565,769 and U.S. Pat. No. 3,445,232 and can be prepared according to known methods, such as e.g. the oxidative dimerization of triarylimidazoles.

In the present invention, one coinitiator or a mixture of coinitiators can be used. Metallocenes are not suitable as coinitiators of the present invention since it has been found that they inter alia affect the yellow light stability.

The amount of coinitiator(s) is not particularly restricted; however, it is preferably in the range of 0.2 to 25 wt.-%, based on the dry layer weight, especially preferred 0.5 to 15 wt.-%.

Optional Additives

Optionally, the radiation-sensitive coating can also comprise an alkali-soluble binder or a mixture of such binders. The binder is preferably selected from polyvinyl acetals, acrylic polymers, polyurethanes and copolymers thereof. It is preferred that the binder contains acid groups, especially preferred carboxy groups. Most preferred are acrylic polymers. Binders with acid groups preferably have acid numbers in the range of 20 to 180 mg KOH/g polymer. Optionally, the binder can comprise groups that are capable of undergoing a cycloaddition (e.g. a 2+2-photocycloaddition). The amount of binder is not particularly restricted and is preferably in the range of 0 to 90 wt.-%, especially preferred 5 to 60 wt.-%, based on the dry layer weight.

The radiation-sensitive coating can optionally also comprise small amounts of a thermopolymerization inhibitor. Suitable examples of inhibitors to prevent an undesired thermopolymerization include e.g. hydroquinone, p-methoxyphenol, di-t-butyl-p-cresol, pyrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of nonabsorbable polymerization inhibitor in the radiation-sensitive coating is preferably 0 to 5 wt.-%, based on the dry layer weight, especially preferred 0.01 to 2 wt.-%. Such inhibitors are often introduced into the radiation-sensitive coating via commercial monomers or oligomers and are therefore not expressly mentioned.

Furthermore, the radiation-sensitive coating of the present invention can comprise dyes or pigments for coloring the layer (contrast dyes and pigments). Examples of colorants include e.g. phthalocyanine pigments, azo pigments, carbon black and titanium dioxide, triarylmethane dyes, such as ethyl violet and crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened layer, the radiation-sensitive coating can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin and tricresyl phosphate. The amount of plasticizer is not particularly restricted, however, it is preferably 0 to 10 wt.-%, based on the dry layer weight, especially preferred 0.25 to 5 wt.-%. Suitable inorganic fillers include for example $Al_2O_3$ and $SiO_2$; they are preferably present in an amount of 0 to 20 wt.-%, based on the dry layer weight, especially preferred 0.1 to 5 wt.-%.

The radiation-sensitive coating can also comprise known chain transfer agents. They are preferably used in an amount of 0 to 15 wt.-%, based on the dry layer weight, especially preferred 0.5 to 5 wt.-%.

Additionally, the radiation-sensitive coating can comprise surfactants (flow improvers). Suitable surfactants include siloxane-containing polymers, fluorine-containing polymers and polymers with ethylene oxide and/or propylene oxide groups. They are preferably present in an amount of 0 to 10 wt-%, based on the dry layer weight, especially preferred 0.2 to 5 wt.-%.

Exposure indicators, such as e.g. 4-phenylazodiphenylamine, can also be present as optional components of the radiation-sensitive coating; they are preferably present in an amount of 0 to 5 wt.-%, especially preferred 0 to 2 wt.-%, based on the dry layer weight.

Substrates

In the production of the lithographic printing plate precursors of the present invention, a dimensionally stable plate or foil-shaped material, including a material in the form of a printer element which is known as a suitable lithographic substrate, is preferably used as a substrate. Examples of such substrates include paper, paper coated with plastic materials (such as polyethylene, polypropylene, or polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the coating. Furthermore, a composite film can be used wherein an aluminum foil has been laminated onto a polyethylene terephthalate film.

The lithographic substrate either has a naturally hydrophilic surface or is subjected to a treatment generating such a surface.

A metal substrate, in particular an aluminum substrate, is preferably subjected to at least one treatment selected from graining (e.g. by brushing in a dry state or brushing with abrasive suspensions, or electrochemical graining, e.g. by means of a hydrochloric acid electrolyte), anodizing (e.g. in sulfuric acid or phosphoric acid) and hydrophilizing.

In order to improve the hydrophilic properties of the surface of the metal substrate that has been grained and optionally anodized in sulfuric acid or phosphoric acid, an interlayer can be provided on the metal substrate by subjecting it e.g. to an aftertreatment with an aqueous solution of sodium silicate, calcium zirconium fluoride, polyvinylphosphonic acid or phosphoric acid. Within the framework of the present invention, the term "substrate" also encompasses an optionally pre-treated substrate exhibiting, for example, a hydrophilizing layer ("interlayer") on its surface.

The details of the above-mentioned substrate pre-treatment are known to the person skilled in the art.

Production of the Printing Plate Precursor

For producing a lithographic printing plate precursor according to the present invention, the radiation-sensitive composition is applied to the hydrophilic surface of the substrate by means of common coating processes (e.g. spin coating, spray coating, dip coating, coating by means of a doctor blade). It is also possible to apply the radiation-sensitive composition on both sides of the substrate; however, for the elements of the present invention, it is preferred that the radiation-sensitive coating be only applied to one side of the substrate.

Usually, the radiation-sensitive composition is applied from an organic solvent or solvent mixture.

Suitable solvents include low alcohols (e.g. methanol, ethanol, propanol and butanol), glycolether derivatives (e.g. ethylene glycol monomethylether, ethylene glycol dimethylether, propylene glycol monomethylether, ethylene glycol monomethylether acetate, ethylene glycol monoethylether acetate, propylene glycol monomethylether acetate, propylene glycol monoethylether acetate, ethylene glycol monoisopropylether acetate, ethylene glycol monobutylether acetate, diethylene glycol monomethylether, diethylene glycol monoethylether), ketones (e.g. diacetone alcohol, acetyl acetone, acetone, methyl ethyl ketone, cyclohexanone, methyl isobutyl ketone), esters (e.g. methyl lactate, ethyl lactate, ethyl acetate, 3-methoxypropyl acetate and butyl acetate), aromatics (e.g. toluene and xylene), cyclohexane, 3-methoxy-2-propanol, 1-methoxy-2-propanol, methoxymethoxyethanol, γ-butyrolactone and dipolar aprotic solvents (e.g. THF, dimethylsulfoxide, dimethylformamide and N-methylpropyrrolidone) and mixtures thereof. The solids content of the radiation-sensitive mixture to be applied depends on the coating method that is used and is preferably 1 to 50 wt.-%.

The dry layer weight of the radiation-sensitive layer is preferably 0.5 to 4 g/m$^2$, more preferably 0.8 to 3 g/m$^2$.

The additional application of a water-soluble oxygen-impermeable overcoat onto the radiation-sensitive layer can be advantageous. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers, polyvinyl methylethers, decyclized copolymers of maleic acid anhydride and a comonomer such as methylvinylether, polyacrylic acid, cellulose ether, gelatin, etc.; polyvinyl alcohol is preferred. Preferably, the composition for the oxygen-impermeable overcoat is applied in the form of a solution in water or in a solvent miscible with water; in any case, the solvent is selected such that the radiation-sensitive coating already present on the substrate essentially does not dissolve upon application of the overcoat composition. The layer weight of the overcoat can e.g. be 0.1 to 6 g/m$^2$, preferably 0.5 to 4 g/m$^2$. However, the printing plate precursors according to the present invention show excellent properties even without an overcoat. The overcoat can also comprise matting agents (i.e. organic or inorganic particles with a particle size of 2 to 20 μm) which facilitate the planar positioning of the film during contact exposure. In order to improve adhesion of the overcoat to the radiation-sensitive layer, the overcoat can comprise adhesion promoters such as e.g. poly(vinylpyrrolidone), poly(ethyleneimine) and poly(vinylimidazole).

Suitable overcoats are described for example in WO 99/06890.

Imaging

The thus produced lithographic printing plate precursors are image-wise exposed in a manner known to the person skilled in the art with radiation of a wavelength of >300 nm (preferably 350 to 480 nm) and subsequently developed with a commercially available aqueous alkaline developer. Metal halide-doped Hg lamps can for example be used as a radiation source. Violet laser diodes emitting UV radiation in the range of about 405 nm (e.g. 405±10 nm) are of particular interest as a radiation source. In addition to ns- and ps-lasers, fs-lasers can be used as well for imaging the lithographic printing plate precursors of the present invention since the sensitizers used in the present invention are capable of simultaneous two-photon excitation. As a rule, fs-lasers provide pulses with a pulse width of <200 fs, a frequency of >70 MHz and an emission wavelength in the range of 690 to 1050 nm. The multi-photon-initiated polymerization has the advantage that a higher resolution can be achieved compared to the one-photon process.

After image-wise exposure, i.e. prior to developing, a heat treatment can be carried out at 50 to 180° C., preferably 90 to 150° C. The developed elements can be treated with a preservative ("gumming") using a common method. The preservatives are aqueous solutions of hydrophilic polymers, wetting agents and other additives.

For certain applications (e.g. in the case of printing plates), it is furthermore advantageous to increase the mechanical strength of the portions of the coating remaining after developing by subjecting them to a heat treatment (what is referred as "baking") and/or a combination of baking and overall exposure (e.g. to UV light). For this purpose, prior to the treatment, the developed element is treated with a solution that protects the non-image areas such that the heat treatment does not cause these areas to accept ink. A solution suitable for this purpose is e.g. described in U.S. Pat. No. 4,355,096.

Baking takes place at a temperature in the range of 150 to 250° C. However, elements such as printing plates prepared from radiation-sensitive elements according to the present invention show excellent properties even without having been subjected to a heat treatment. When both baking and overall exposure are carried out, the two treatment steps can be performed simultaneously or one after the other.

Advantages

The radiation-sensitive elements according to the present invention are characterized by excellent stability under yellow light conditions, a high degree of photosensitivity and excellent resolution in combination with good storage stability. In the case of printing plate precursors, the developed printing plates exhibit excellent abrasion resistance which allows a high print run length.

The invention will be explained in more detail in the following examples; however, they shall not restrict the invention in any way.

EXAMPLES

Examples 1 to 9 and Comparative Examples 1 to 5

An electrochemically grained (in HCl) and anodized aluminum foil was subjected to a treatment with an aqueous solution of polyvinylphosphonic acid (PVPA) and, after drying, coated with a solution as described below and dried:

The printing plate precursor was image-wise exposed with an image-setter Andromeda® A750M from Lithotech, equipped with a laser diode (405 nm; P=30 mW). For this purpose, a UGRA gray scale V2.4 with defined tonal values was used. Additionally, the sensitivity of the plate was determined using an UGRA offset test strip 1982 under overall exposure.

Immediately after exposure, the plate was heated in an oven for 2 minutes at 90° C.

Then, the exposed plate was treated for 30 seconds with an aqueous developer solution having a pH value of 12 and comprising KOH as an alkaline component as well as a tenside (poly(ethylene glycol)naphthylether).

Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

For the assessment of the storage stability of the plates, the unexposed printing plate precursors were stored for 60 minutes in a 90° C. oven, then exposed and developed as described above (storage stability test).

For the preparation of a lithographic printing plate, a printing layer was applied to the aluminum foil as explained above, exposed, heated, developed, and after rinsing with water, the developed plate was rubbed and gummed with an aqueous solution of 0.5% phosphoric acid and 6% gum arabic. The thus prepared plate was loaded in a sheet-fed offset

| | | |
|---|---|---|
| 1.62 g | Copolymer of allyl methacrylate and methacrylic acid; acid number 55 | |
| 0.02 g | Kayamer PM-2 (1 mole phosphoric acid esterified with 1.5 moles hydroxyethyl methacrylate from Coa Corp. Ltd., Japan) | |
| 0.124 g | mercapto-3-triazole | |
| 2.745 g | of an 80% methyl ethyl ketone solution of a urethane acrylate prepared by reacting Desmodur N 100 ® (available from Bayer) with hydroxyethyl acrylate and pentaerythritol triacrylate; amount of double bonds: 0.5 double bonds per 100 g when all isocyanate groups have completely reacted with the acrylates containing hydroxy groups | |
| 0.15 g | HB-NK Ester BPE 500 (2,2-bis(4-(methacryloxypolyethoxy)phenyl)propane; EO 10 mole; available from Shin-Nakamura) | |
| 0.28 g | of a dispersion in propylene glycol monomethylether comprising 7.25 wt.-% copper phthalocyanine and 7.25 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid | |
| Y g | coinitiator according to Table 3 | |
| X g | sensitizer according to Table 3 | |
| 9 g | propylene glycol monomethylether | |
| 6 g | methanol | |
| 7.25 g | butanone | |

The solution was filtered, applied to the lithographic substrate and the coating was dried for 4 minutes at 90° C. The dry layer weight of the photopolymer layer was about 1.5 g/m$^2$.

The obtained samples were coated with an overcoat by applying an aqueous solution of poly(vinylalcohol) (Airvol 203 available from Airproducts; degree of hydrolysis: 88%); after drying for 4 minutes at 90° C., the overcoat had a dry layer weight of about 3 g/m$^2$.

printing machine and used for printing with an abrasive printing ink (Offset S 7184® available from Sun Chemical, containing 10% potassium carbonate). The results are summarized in Table 3.

The results in Table 3 show that by using a sensitizer of formula (I), printing plates with a high degree of sensitivity (both in the case of fresh plates and in the case of aged plates) can be obtained which can be used for printing high numbers of copies.

TABLE 3

| Example | Type of sensitizer[0] | Amount of sensitizer in g | Van der Waals volume (Å³) of $R_9$-$R_{12}$ | Color of fluorescence | Type of coinitiator | Amount of coinitiator in g | Exposure energy (μJ/cm²) at 405 nm[1] | Exposure energy (μJ/cm²) at 405 nm 60 min/90° C.[2] | Printing results |
|---|---|---|---|---|---|---|---|---|---|
| 1 | S1 | 0.25 | 74 | green | o-Cl-Habi[3] | 0.175 | 95 | 90 | up to 100,000 copies no abrasion |
| 2 | S2 | 0.1 | 74 | green | o-Cl-Habi[3] | 0.175 | 85 | 90 | up to 100,000 copies no abrasion |
| 3 | S3 | 0.1 | 74 | green | o-Cl-Habi[3] | 0.175 | 90 | 100 | up to 100,000 copies no abrasion |
| 4 | S4 | 0.08 | 74 | yellow | o-Cl-Habi[3] | 0.175 | 75 | 80 | up to 100,000 copies no abrasion |
| 5 | S5 | 0.1 | 74 | greenish | o-Cl-Habi[3] | 0.175 | 80 | 75 | up to 100,000 copies no abrasion |
| 6 | S6 | 0.1 | 74 | green | o-Cl-Habi[3] | 0.175 | 85 | 85 | up to 100,000 copies no abrasion |
| 7 | S1 | 0.25 | 74 | green | iodonium salt I[4] | 0.25 | 160 | 170 | up to 100,000 copies no abrasion |
| 8 | S2 | 0.1 | 74 | green | iodonium salt I[4] | 0.25 | 150 | 160 | up to 100,000 copies no abrasion |
| 9 | S3 | 0.1 | 74 | green | iodonium salt I[4] | 0.25 | 170 | 180 | up to 100,000 copies no abrasion |
| Comparative 1 (EP 1349006) | 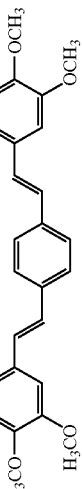 | 0.15 | 29 | blue | o-Cl-Habi[3] | 0.175 | 300 | no image | visible abrasion after 15,000 copies |
| Comparative 2 (EP 1445120) | 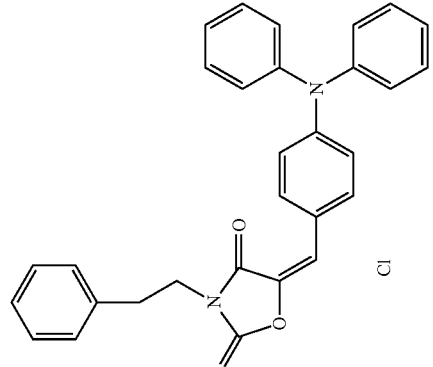 | 0.10 | — | yellow | o-Cl-Habi[3] | 0.175 | 380 | no image | visible abrasion after 25,000 copies |

TABLE 3-continued

| Example | Type of sensitizer[0] | Amount of sensitizer in g | Van der Waals volume (Å³) of R$_9$-R$_{12}$ | Color of fluorescence | Type of coinitiator | Amount of coinitiator in g | Exposure energy (μJ/cm²) at 405 nm[1] | Exposure energy (μJ/cm²) at 405 nm 60 min/90° C.[2] | Printing results |
|---|---|---|---|---|---|---|---|---|---|
| Comparative 3 (JP2002221790) | [structure: benzoxazole–CH=CH–phenyl–N(CH$_3$)$_2$] | 0.10 | 0 | green | o-Cl-Habi[3] | 0.175 | no image | no image | — |
| Comparative 4 (JP2002221790) | [structure: benzoxazole with CN substituent, vinyl linked to phenyl–N(4-methoxyphenyl)$_2$] | 0.10 | 0 | yellow | o-Cl-Habi[3] | 0.175 | >>400 | no image | — |
| Comparative 5 | [structure: 5-ethyl-benzoxazole–CH=CH–phenyl–N(phenyl)$_2$] | 0.1 | 40 | yellow | o-Cl-Habi[3] | 0.175 | 380 | 400 | visible abrasion after 25,000 copies |

[0]The designations S1-S14 refer to the structures S1-S14 shown above
[1]Energy required to obtain one step of an UGRA gray scale on a fresh plate
[2]Storage stability test: Energy required to obtain one step of an UGRA gray scale on a plate that has been stored for 60 minutes at 90° C.
[3]2,2-Bis-(2-chlorophenyl)-4,5,4',5'-tetraphenyl-2?H-[1,2']biimidazolyl
[4]Diphenyl iodonium chloride
[5]4-Phenyl-1-methoxypyridinium Examples 10 to 12 and Comparative Examples 6 to 8

Yellow light stability is an important factor with respect to lithographic printing plate precursors which are imaged with wavelengths of about 400 nm; therefore, different plate precursors were examined for their yellow light stability.

Precursors with the coatings specified in Table 3 were exposed under defined yellow light conditions (yellow light tube L36W/62 from Osram) to overall exposure with an intensity of 1860 lux at intervals of 0.5, 1, 5, 10, 20 and 30 min; immediately afterwards, they were heated to 90° C. in an oven for two minutes and developed as described in Example 1. Then the optical density was determined with a densitometer (XRITE Spectrodensitometer) and plotted against the yellow light energy in lux·min. The optical density of the substrate was 0.28; an increase in the optical density signifies damage to the plate (partial exposure) since after developing there are still coating residues in the non-image areas. Such a damaged plate is no longer usable for printing since it can lead to toning in the printing machine. In order to be able to judge the yellow light stability, the exposure necessary to damage the plate was measured; basically, a higher the yellow light energy means higher yellow light stability. The results can be inferred from Table 4; in addition, the results of Example 10 and Comparative Example 6 are graphically illustrated in FIG. 1.

value is observed (i.e. ITV≠0). The higher the increase in tonal value, the lower the resolution of the plate.

The plates were exposed such that at least two steps of a UGRA gray scale were obtained. Of this plate, the different tonal values (MTV) for the developed plate were determined by means of a Digital Microscope DMA 910 from Techkon and used as a basis for the calculation of the increase in tonal value. These ITV values were added for all tonal values (i) to obtain a value indicating the total deviation over all tonal values (STD).

$$STD = \sum_i [MTV(i) - STV(i)]$$

Figure 2:
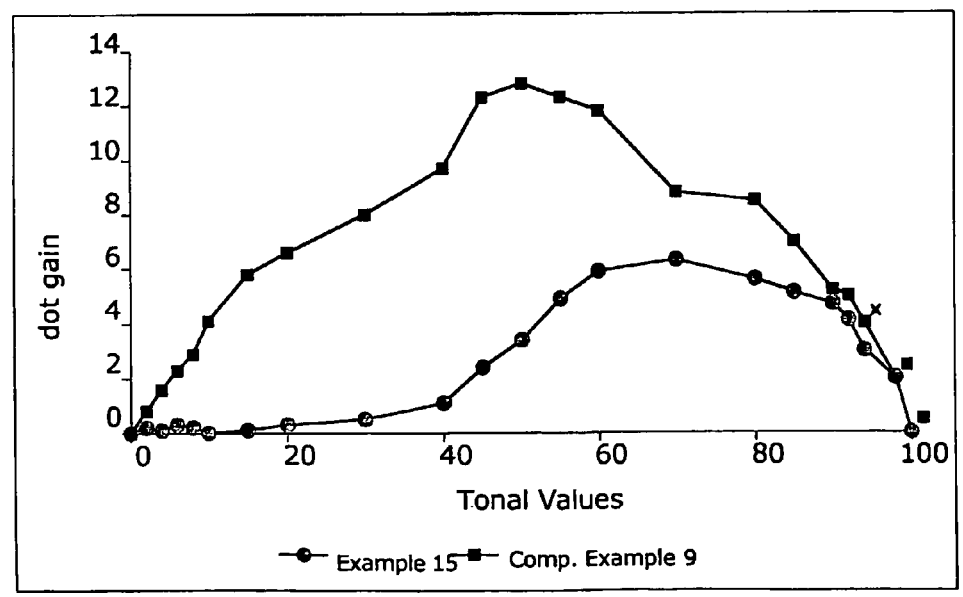
FIG. 2 shows the deviation from the measured tonal value and predetermined set tonal value (also known as "dot gain") for the plates of Example 15 and Comparative Example 9; this illustrates the improved resolution of the plate according to the present invention.

The results can be inferred from Table 5. Furthermore, the differences between measured tonal values and predetermined set tonal values of Example 15 and Comparative Example 9 are graphically illustrated in FIG. 2.

The smaller the deviation of the measured tonal value from the predetermined set tonal value, the higher the resolution of the plate.

TABLE 4

| Example | Amount of titanocene[6] (g) | Coating | Exposure necessary for damaging the plate (lux · min) |
|---|---|---|---|
| 10 | 0 | as in Example 1 | >60,000, no damage of the plate was observed, experiment was discontinued |
| 11 | 0 | as in Example 2 | >60,000, no damage of the plate was observed, experiment was discontinued |
| 12 | 0 | as in Example 3 | >60,000, no damage of the plate was observed, experiment was discontinued |
| Comp. Example 6 | 0.15 | as in Example 1 but with titanocene instead of o-Cl-Habi[3] | >930 but less than 1860 |
| Comp. Example 7 | 0.15 | as in Comp. Example 2 but with titanocene instead of o-Cl-Habi[3] | >930 but less than 1860 |
| Comp. Example 8 | 0.25; decrease in sensitivity when less titanocene is used | as in Comp. Example 3 but with titanocene instead of o-Cl-Habi[3] | >930 but less than 1860 |

[6]Irgacure 784 (bis-(η-5-2,4-cyclopentadiene-1-yl)-bis-(2,6-difluoro-3-(1H-pyrrol-1-yl)-phenyl)-titanium; from CIBA)

Examples 13 to 15 and Comparative Examples 9 and 10

In the middle part of the tonal value range, printing plate precursors with photopolymers for the UV, violet and visible ranges usually exhibit tonal values that are higher than desired. The tonal value indicates what percentage of the area to be imaged is covered. The person skilled in the art is aware of the increase in tonal value (ITV) and it is given as the difference between measured tonal values (MTV) and predetermined set tonal values (STV). Under optimum conditions, a straight line is obtained on the X-axis when the difference is plotted against the tonal values, i.e. ITV equals 0 for all tonal values (i). In this case, the plate would exhibit a very high resolution because the information to be imaged is transferred 1:1. However, under real conditions, an increase in tonal

TABLE 5

| Example | Coating of the plate | total deviation over all tonal values (STD) in % |
|---|---|---|
| 13 | as in Example 1 | 60 |
| 14 | as in Example 2 | 55 |
| 15 | as in Example 3 | 50 |
| Comparative 9 (WO 2004074930 A2) | as in Example 1 but instead of S1 2-phenyl-4-(2-chlorophenyl)-5-(4-diethylaminophenyl)-oxazole was used in an amount of 0.25 g | 160 |
| Comparative 10 | as in Comparative Example 1 | 170 |

The invention claimed is:
1. Lithographic printing plate precursor comprising
(a) a lithographic substrate with a hydrophilic surface and
(b) a radiation-sensitive coating on the hydrophilic surface comprising
    (i) one or more types of monomers and/or oligomers and/or polymers, each comprising at least one ethylenically unsaturated group accessible to a free-radical polymerization,
    (ii) at least one sensitizer, and
    (iii) at least one coinitiator capable of forming free radicals together with the sensitizer (ii), said coinitiator being other than metallocenes,
characterized in that the at least one sensitizer comprises a compound of formula (Ia) or (Ib):

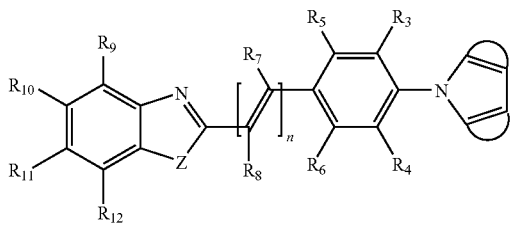

wherein
$R_4$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from H, alkyl, aryl, aralkyl and alkylaryl;
$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl;
$R_4$ and $R_6$ can form a 5- or 6-membered fused aromatic ring;
$R_7$ and $R_8$ are independently selected from the group consisting of hydrogen, CN, halogen, and unsubstituted and substituted alkyl, alkylaryl, aralkyl, and aryl;
n is selected from 0, 1 and 2;
Z represents O, S, Se or NR, wherein R is selected from the group consisting of hydrogen, alkyl, aryl, aralkyl and alkylaryl;
$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl and alkylaryl,
provided that at least one of the groups $R_9$ to $R_{12}$ is a bulky group which has a van der Waals volume of at least 55 Å$^3$;
each dotted line in Formula 1a

)

represents an optionally present fused benzene ring;
each R' is independently selected from halogen, alkyl, alkoxy, CN, NO$_2$, NR''$_2$, C(O)H, COOR'', OR'' and SR'';
each R'' is independently selected from hydrogen, alkyl and aryl; and
m is 0 or an integer from 1 to 4;
and wherein:
$R_3$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$ and —PO$_3$(R)$_2$, wherein each R is selected from H, alkyl, aryl, aralkyl and alkylaryl;
$R_1$ is selected from the group consisting of hydrogen, unsubstituted and substituted aryl, unsubstituted and substituted heteroaryl, and unsubstituted and substituted alkyl; and
$R_3$ and $R_5$ can form a 5- or 6-membered fused aromatic ring.
2. Lithographic printing plate precursor according to claim 1, wherein only one of the groups $R_9$ to $R_{12}$ is a bulky group.
3. Lithographic printing plate precursor according to claim 1, wherein the sensitizer comprises a compound selected from S1-S7:

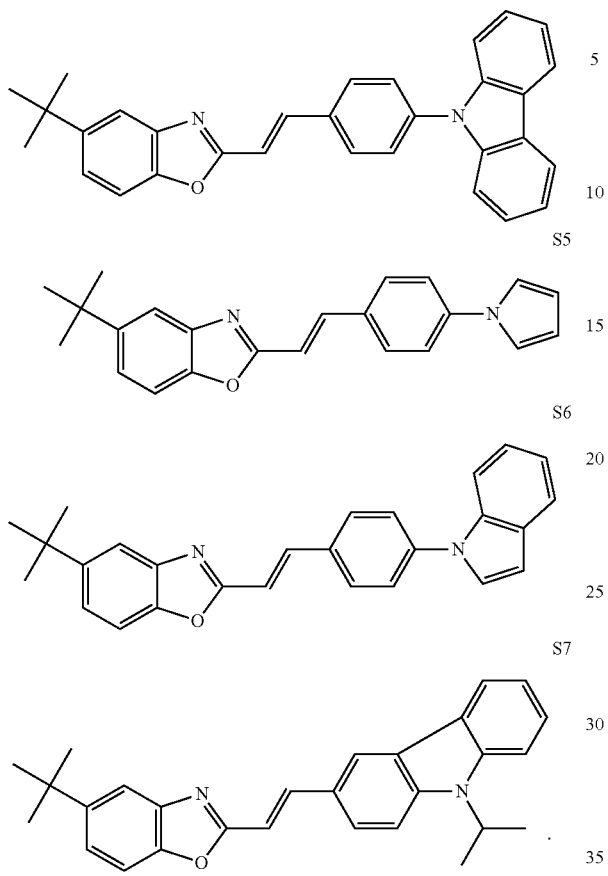

4. Lithographic printing plate precursor according to claim 1, wherein the coinitiator (iii) is selected from the group consisting of 1,3,5-triazine derivatives with one to three $CX_3$ groups, wherein X represents chlorine or bromine; peroxides; hexaarylbiimidazoles; oxime ethers; oxime esters; N-aryl glycines and derivatives thereof; thiol compounds; N-aryl, S-aryl and O-aryl polycarboxylic acids with at least 2 carboxyl groups of which at least one is bonded to the N, S or O atom of the aryl unit; onium salts; alkyltriarylborates; benzoin ethers; benzoin esters; trihalogenomethylarylsulfones; amines; N,N-dialkylaminobenzoic acid esters; aromatic sulfonyl halides; imides; diazosulfonates; 9,10-dihydroanthracene derivatives; acylphosphine oxides; diacylphosphine oxides; α-hydroxy and α-amino acetophenones; and mixtures thereof.

5. Lithographic printing plate precursor according to claim 1, which further comprises an oxygen-impermeable overcoat.

6. Process for imaging a lithographic printing plate precursor according to claim 1 comprising
    (a) image-wise exposure of a lithographic printing plate precursor as defined in claim 1 to UV radiation of >300 nm;
    (b) removing non-exposed areas of the coating by means of an aqueous alkaline developer.

7. Process according to claim 6, wherein the exposed precursor obtained in step (a) is heated prior to step (b).

8. Process according to claim 6, wherein the developed precursor obtained in step (b) is subsequently subjected to at least one treatment selected from heating and overall exposure.

9. Process according to claim 6, wherein image-wise exposure is carried out with UV radiation of a wavelength in the range of 350 to 480 nm.

10. Process for the production of a radiation-sensitive lithographic printing plate precursor according to claim 1 comprising
    (a) applying a radiation-sensitive composition onto the hydrophilic surface of a lithographic substrate and
    (b) drying,
wherein the radiation-sensitive composition comprises:
    (i) one or more types of monomers and/or oligomers and/or polymers, each comprising at least one ethylenically unsaturated group accessible to a free-radical polymerization,
    (ii) at least one sensitizer,
    (iii) at least one coinitiator capable of forming free radicals together with the sensitizer (ii), said coinitiator being other than metallocenes, and
    (iv) at least one solvent,
characterized in that the sensitizer comprises a compound of formula (Ia) or (Ib):

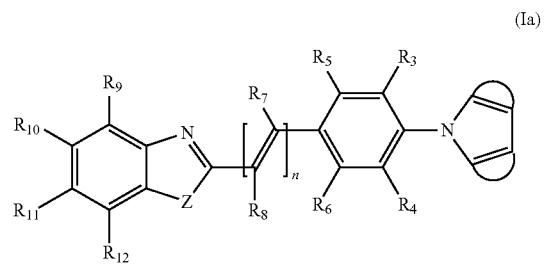

(Ia)

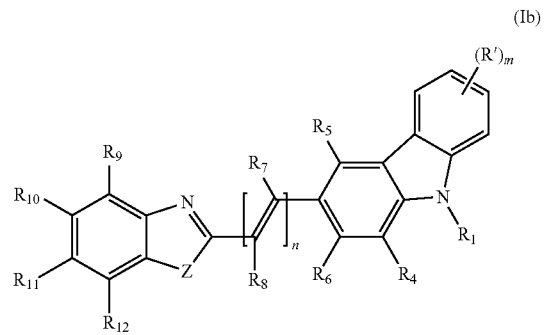

(Ib)

wherein
    $R_4$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —$SO_2$R, —$SO_3$R, —$NO_2$, $N(R)_2$, $N(R)_3^+$, and —$PO_3(R)_2$, wherein each R is selected from H, alkyl, aryl, aralkyl and alkylaryl;
    $R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —$SO_2$R, —$SO_3$R, —$NO_2$, $NR_2$, $NR_3^+$, and —$PO_3R_2$, wherein each R is selected from the group consisting of H, alkyl, aryl, aralkyl and alkylaryl;
    $R_4$ and $R_6$ can form a 5- or 6-membered fused aromatic ring;
    $R_7$ and $R_8$ are independently selected from the group consisting of hydrogen, CN, halogen, and unsubstituted and substituted alkyl, alkylaryl, aralkyl, and aryl;
    n is selected from 0, 1 and 2;

Z represents O, S, Se or NR, wherein R is selected from the group consisting of hydrogen, alkyl, aryl, aralkyl and alkylaryl;

$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, NR$_{(3)}$$^+$, and —PO$_3$(R)$_2$, wherein each R is selected from the group consisting of H, alkyl, aryl, aralkyl and alkylaryl, provided that at least one of the groups $R_9$ to $R_{12}$ is a bulky group which has a van der Waals volume of at least 55 Å$^3$;

each dotted line in Formula 1a

represents an optionally present fused benzene ring:
each R' is independently selected from halogen, alkyl, alkoxy, CN, NO$_2$, NR''$_2$, C(O)H, COOR'', OR'' and SR'';
each R'' is independently selected from hydrogen, alkyl and aryl; and
m is 0 or an integer from 1 to 4;
and wherein
$R_3$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3$$^+$ and —PO$_3$(R)$_2$, wherein each R is selected from H, alkyl, aryl, aralkyl and alkylaryl;
$R_1$ is selected from the group consisting of hydrogen, unsubstituted and substituted aryl, unsubstituted and substituted heteroaryl, and unsubstituted and substituted alkyl; and
$R_3$ and $R_5$ can form a 5- or 6-membered fused aromatic ring.

11. Process according to claim 10, wherein the substrate is an aluminum substrate which was subjected to at least one treatment selected from graining, anodizing and hydrophilizing.

12. Radiation-sensitive composition comprising
(i) one or more types of monomers and/or oligomers and/or polymers, each comprising at least one ethylenically unsaturated group accessible to a free-radical polymerization,
(ii) at least one sensitizer,
(iii) at least one coinitiator capable of forming free radicals together with the sensitizer (ii), said coinitiator being other than metallocenes, and
(iv) at least one solvent,
characterized in that the sensitizer comprises a compound of formula (Ia) or (Ib):

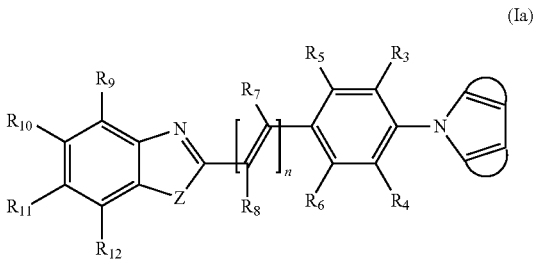

(Ia)

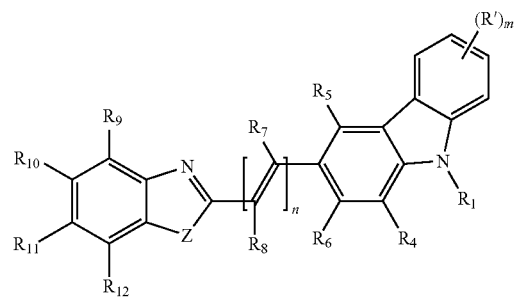

(Ib)

wherein
$R_4$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3$$^+$, and —PO$_3$(R)$_2$, wherein each R is selected from H, alkyl, aryl, aralkyl and alkylaryl;

$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3$$^+$, and —PO$_3$(R)$_2$, wherein each R is selected from the group consisting of H, alkyl, aryl, aralkyl and alkylaryl;

$R_4$ and $R_6$ can form a 5- or 6-membered fused aromatic ring;

$R_7$ and $R_8$ are independently selected from the group consisting of hydrogen, CN, halogen, and unsubstituted and substituted alkyl, alkylaryl, aralkyl, and aryl;

n is selected from 0, 1 and 2;

Z represents O, S, Se or NR, wherein R is selected from the group consisting of hydrogen, alkyl, aryl, aralkyl and alkylaryl;

$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3$$^+$, and —PO$_3$(R)$_2$, wherein each R is selected from the group consisting of H, alkyl, aryl, aralkyl and alkylaryl, provided that at least one of the groups $R_9$ to $R_{12}$ is a bulky group which has a van der Waals volume of at least 55 Å$^3$;

each dotted line in Formula 1a

represents an optionally present fused benzene ring;
each R' is independently selected from halogen, alkyl, alkoxy, CN, NO$_2$, NR''$_2$, C(O)H, COOR'', OR'' and SR'';
each R'' is independently selected from hydrogen, alkyl and aryl; and
m is 0 or an integer from 1 to 4;
and wherein
$R_3$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3$$^+$ and —PO$_3$(R)$_2$, wherein each R is selected from H, alkyl, aryl, aralkyl and alkylaryl;

$R_1$ is selected from the group consisting of hydrogen, unsubstituted and substituted aryl, unsubstituted and substituted heteroaryl, and unsubstituted and substituted alkyl; and $R_3$ and $R_5$ can form a 5- or 6-membered fused aromatic ring.

13. UV-sensitive sensitizer of the formula (Ia) or (Ib)

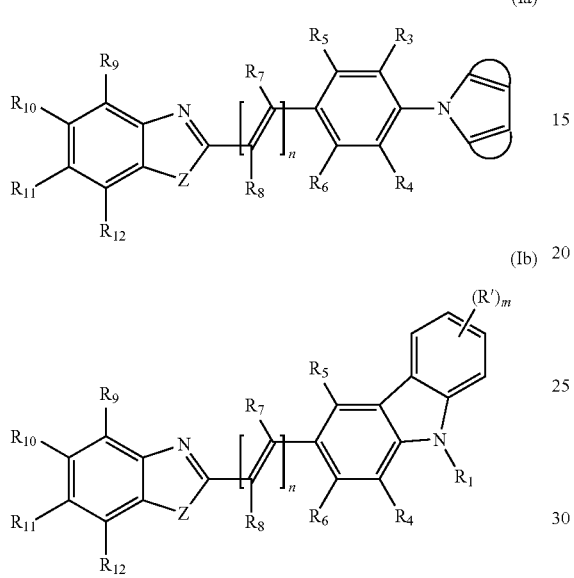

wherein
$R_4$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from H, alkyl, aryl, aralkyl and alkylaryl;

$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl and alkylaryl;

$R_4$ and $R_6$ can form a 5- or 6-membered fused aromatic ring;

$R_7$ and $R_8$ are independently selected from the group consisting of hydrogen, CN, halogen, and unsubstituted and substituted alkyl, alkylaryl, aralkyl, and aryl;

n is selected from 0, 1 and 2;

Z represents O, S, Se or NR, wherein R is selected from the group consisting of hydrogen, alkyl, aryl, aralkyl and alkylaryl;

$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$, and —PO$_3$(R)$_2$, wherein each R is selected from the group consisting of H, alkyl, aryl, aralkyl and alkylaryl, provided that at least one of the groups $R_9$ to $R_{12}$ is a bulky group which has a van der Waals volume of at least 55 Å$^3$;

each dotted line in Formula 1a

)

represents an optionally present fused benzene ring;

each R' is independently selected from halogen, alkyl, alkoxy, CN, NO$_2$, NR''$_2$, C(O)H, COOR'', OR'' and SR'';

each R'' is independently selected from hydrogen, alkyl and aryl; and m is 0 or an integer from 1 to 4;

and wherein $R_3$ is selected from the group consisting of hydrogen, CN, halogen, unsubstituted and substituted alkyl, aralkyl, alkylaryl and aryl, —O-alkyl, —O-aryl, —S-alkyl, —COOR, —SOR, —SO$_2$R, —SO$_3$R, —NO$_2$, N(R)$_2$, N(R)$_3^+$ and —PO$_3$(R)$_2$, wherein each R is selected from H, alkyl, aryl, aralkyl and alkylaryl;

$R_1$ is selected from the group consisting of hydrogen, unsubstituted and substituted aryl, unsubstituted and substituted heteroaryl, and unsubstituted and substituted alkyl; and $R_3$ and $R_5$ can form a 5- or 6-membered fused aromatic ring.

14. The UV-sensitive sensitizer of claim 13 that is a compound selected from S1-S7:

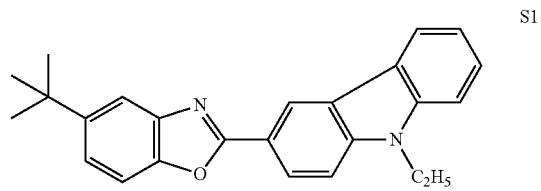

S1

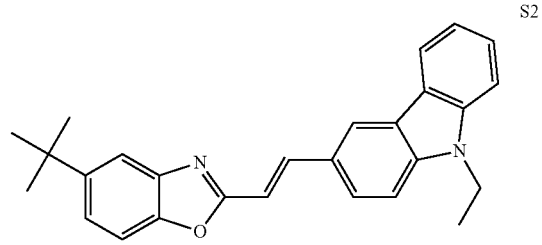

S2

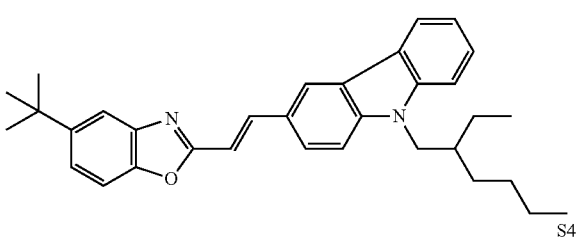

S3

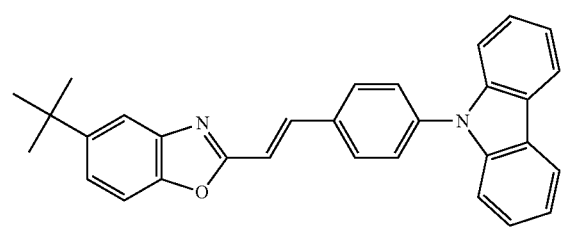

S4

S5
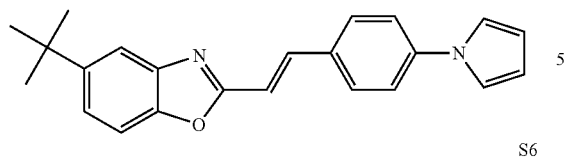
S6
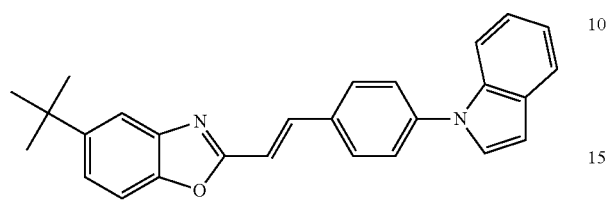
S7
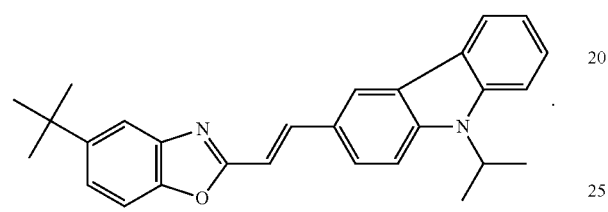
\* \* \* \* \*